(12) United States Patent
Yuan et al.

(10) Patent No.: US 8,589,754 B2
(45) Date of Patent: Nov. 19, 2013

(54) METHOD FOR ENCODING OR DECODING LDPC CODE WITH VARIABLE LENGTH, DEVICE, ENCODER, AND DECODER

(75) Inventors: Jinhong Yuan, Sydney (AU); Jun Ning, Sydney (AU); Yue Liu, Hangzhou (CN); Xi Yan, Shenzhen (CN); Guangjian Wang, Shenzhen (CN); Yanxing Zeng, Shenzhen (CN); Weiguang Liang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 420 days.

(21) Appl. No.: 13/111,191

(22) Filed: May 19, 2011

(65) Prior Publication Data

US 2011/0283159 A1    Nov. 17, 2011

Related U.S. Application Data

(63) Continuation of application No. PCT/CN2009/074529, filed on Oct. 20, 2009.

(30) Foreign Application Priority Data

Nov. 19, 2008 (CN) .......................... 2008 1 0217377

(51) Int. Cl.
*H03M 13/11* (2006.01)
(52) U.S. Cl.
USPC .......................................................... 714/758
(58) Field of Classification Search
USPC .......................................... 714/752, 755, 758
See application file for complete search history.

(56) References Cited

U.S. PATENT DOCUMENTS

| | | | | |
|---|---|---|---|---|
| 7,451,374 B2 * | 11/2008 | Kim et al. | ...................... | 714/748 |
| 7,634,711 B2 * | 12/2009 | Piret et al. | ...................... | 714/781 |
| 7,689,892 B2 * | 3/2010 | Stolpman et al. | .............. | 714/774 |
| 7,694,207 B1 * | 4/2010 | Kline et al. | ................... | 714/782 |
| 7,707,479 B2 * | 4/2010 | Niu et al. | ....................... | 714/758 |
| 7,725,801 B2 * | 5/2010 | Jeong et al. | ................... | 714/755 |

(Continued)

FOREIGN PATENT DOCUMENTS

| | | | |
|---|---|---|---|
| CN | 1540871 A | 10/2004 | |
| CN | 1558556 A | 12/2004 | |

(Continued)

OTHER PUBLICATIONS

Chinese first Office Action mailed Jul. 3, 2012, issued in related Chinese Patent Application No. 200810217377.7 (18 pages).

(Continued)

*Primary Examiner* — James C Kerveros
(74) *Attorney, Agent, or Firm* — Conley Rose, P.C.; Grant Rodolph; Nicholas K. Beaulieu

(57) ABSTRACT

A method for encoding or decoding an LDPC code with variable code lengths is provided in an embodiment of the present invention. The method includes: obtaining a base exponential matrix of an LDPC code and grouping code lengths during construction of the base exponential matrix; correcting the base exponential matrix according to a grouping correction factor to obtain an exponential matrix of the group corresponding to the grouping correction factor; extending the exponential matrix by using an extension factor of a code length in the group to obtain an LDPC matrix corresponding to the code length; and implementing encoding or decoding by using the LDPC matrix.

14 Claims, 5 Drawing Sheets

(56) References Cited

U.S. PATENT DOCUMENTS

| | | | |
|---|---|---|---|
| 7,747,929 B2 * | 6/2010 | Kyung et al. | 714/779 |
| 7,757,150 B2 * | 7/2010 | Stolpman | 714/752 |
| 7,853,862 B2 * | 12/2010 | Lakkis | 714/800 |
| 8,185,797 B2 * | 5/2012 | Jun et al. | 714/758 |
| 8,516,334 B2 * | 8/2013 | Xu et al. | 714/758 |
| 2007/0033483 A1 | 2/2007 | Jeong et al. | |
| 2009/0106625 A1 | 4/2009 | Jun et al. | |

FOREIGN PATENT DOCUMENTS

| | | |
|---|---|---|
| CN | 1770640 A | 5/2006 |
| CN | 1953335 | 4/2007 |
| WO | WO2004047019 A2 | 6/2004 |
| WO | WO 2006/039801 A1 | 4/2006 |
| WO | WO 2010057407 A1 | 5/2010 |

OTHER PUBLICATIONS

Extended European Search Report dated (mailed) Apr. 19, 2012, issued in related Application No. 09827156.2, PCT/CN2009074529, Hauwei Technologies Co., Ltd.

International Search Report for International Application No. PCT/CN2009/074529, mailed Jan. 28, 2010 Huawei Technologies Co., Ltd.

Written Opinion of the International Searching Authority (translation) dated (mailed) Jan. 28, 2010, issued in related Application No. PCT/CN2009074529, filed Oct. 20, 2009, Huawei Technologies Co., Ltd.

* cited by examiner $$\mathbf{P}^0 = \begin{bmatrix} 1 & 0 & \cdots & 0 & 0 \\ 0 & 1 & \cdots & 0 & 0 \\ \vdots & \vdots & \ddots & \vdots & \vdots \\ 0 & 0 & \cdots & 1 & 0 \\ 0 & 0 & \cdots & 0 & 1 \end{bmatrix}$$

$$\mathbf{P}^1 = \begin{bmatrix} 0 & 1 & \cdots & 0 & 0 \\ 0 & 0 & \cdots & 0 & 0 \\ \vdots & \vdots & \ddots & \vdots & \vdots \\ 0 & 0 & \cdots & 0 & 1 \\ 1 & 0 & \cdots & 0 & 0 \end{bmatrix}$$

$$\mathbf{P}^i = \begin{bmatrix} \overbrace{0 \quad 0 \quad \cdots \quad 0}^{i} & 1 & 0 & 0 & 0 \\ 0 & 0 & \cdots & 0 & 0 & 1 & 0 & 0 \\ \vdots & \vdots & \ddots & \vdots & \vdots & \vdots & \vdots & \vdots \\ 0 & 0 & \cdots & 0 & 0 & 0 & 0 & 1 \\ 1 & 0 & \cdots & 0 & 0 & 0 & 0 & 0 \\ 0 & 1 & \cdots & 0 & 0 & 0 & 0 & 0 \\ \vdots & \vdots & \ddots & \vdots & \vdots & \vdots & \vdots & \vdots \\ 0 & 0 & \cdots & 1 & 0 & 0 & 0 & 0 \end{bmatrix}_{Z_1 \times Z_1}$$

FIG 3

METHOD FOR ENCODING OR DECODING LDPC CODE WITH VARIABLE LENGTH, DEVICE, ENCODER, AND DECODER

CROSS-REFERENCE TO RELATED APPLICATIONS

This application is a continuation of International Application No. PCT/CN2009/074529, filed on Oct. 20, 2009, which claims priority to Chinese Patent Application No. 200810217377.7, filed on Nov. 19, 2008, both of which are hereby incorporated by reference in their entireties.

FIELD OF THE INVENTION

The present invention relates to an error correction coding technology in a communication and information system, and in particular, to a method and device for encoding or decoding a low density parity check (LDPC) code with variable lengths, an encoder, and a decoder.

BACKGROUND

An LDPC code is a linear packet code proposed by Gallager in 1962. In the check matrix of the LDPC code, the number of 1 is small. The LDPC code was re-proposed by Mackay in 1996 with improvements. In addition to a check matrix, the Tanner graph (see FIG. 1) can also be adopted to represent an LDPC code. The Tanner graph is directly related to the check matrix, and consists of variable nodes, check nodes, and edges that connect them. Each check node $z_i$ is related to row i in the check matrix. Each variable node $x_j$ is related to column j in the check matrix. When bit j in the code word participates in check equation i, that is, when the element value of the position of row i and column j in the check matrix is 1, a connection line exists between the check node and the variable node in FIG. 1. The number of edges connected to a node is called the number of dimensions of this node.

The LDPC code is a high-performing error correction coding technology that is widely applied. The main features of the LDPC code are the support for iterative decoding, and its performance is approximate to the Shannon capacity limit. A cycle in the Tanner graph is a path that connects the check node and variable node, starts and ends at the same node, but does not include the same node repetitively. The length of a cycle is the number of edges. The length of the shortest cycle is called the girth of the Tanner graph. The Tanner graph of the LDPC code with limited code length inevitably has cycles. The girth of the Tanner graph, however, greatly affects the performance of the code word. The quasi-cyclic LDPC code obtains the check matrix by extending the exponential matrix through the extension factor, and features simple storage and flexible support for various code lengths.

Currently, the quasi-cyclic LDPC code based on cyclic shift matrix is commonly used. Its check matrix $H_{m \times n}$ may be viewed as obtained by extending the mother matrix M(H) whose size is $m_b \times n_b$ through extension factor z, wherein: $n = z \times n_b$, $m = z \times m_b$, is an integer, n indicates the code length, and m indicates the number of check bits in the code word. During extension, element 1 in M(H) is replaced by the $z \times z$ right cyclic shift matrix, and element 0 is replaced by the $z \times z$ zero matrix. Each cyclic unit matrix in $H_{m \times n}$ may be specified by its right cyclic shift amount. The mother matrix information and cyclic shift information can be integrated into a base check matrix, that is, exponential matrix E(H). 0 in M(H) is replaced by −1 to define a $z \times z$ zero matrix. Element 1 is replaced by the cyclic shift amount. E(H) can be directly extended through the extension factor to obtain $H_{m \times n}$. Based on a quasi-cyclic LDPC code, a check matrix can be obtained by extending the mother matrix or exponential matrix through the extension factor, which features simple storage and flexible support for various code lengths.

In current implementations, however, a quasi-cyclic LDPC code supports increase of code lengths only by integral multiples, or is of numerous limitations during construction. Consequently, the performance of an LDPC code supported by a matrix at each required code length is far different from the performance of the LDPC code in independent design.

SUMMARY

A method for encoding or decoding an LDPC code with variable code lengths, a device, an encoder, and a decoder are provided in an embodiment of the present invention to support continuous changes in the supported code lengths.

A method for encoding or decoding an LDPC code with variable code lengths is provided in an embodiment of the present invention. The method includes:

obtaining a base exponential matrix of an LDPC code and grouping code lengths during construction of the base exponential matrix;

correcting the base exponential matrix according to grouping correction factors to obtain an exponential matrix of a group corresponding to the grouping correction factor;

extending the exponential matrix according to an extension factor corresponding to a code length in the group to obtain an LDPC matrix corresponding to the code length; and encoding or decoding the LDPC code according to the LDPC matrix.

A device for constructing an LDPC code is provided in an embodiment of the present invention. The device includes:

a grouping unit, configured to group code lengths; and
a base exponential matrix constructing unit, configured to: construct a base exponential matrix; construct a mother matrix and an exponential matrix of a first group during a first exponential matrix construction; construct an exponential matrix of a second group based on the mother matrix and exponential matrix of the first group during a second matrix construction; repeat the construction of another exponential matrix based on the mother matrix of the first group and the exponential matrix of the previous group until exponential matrixes of all groups are constructed to obtain a base exponential matrix, where the base exponential matrix is an exponential matrix obtained through the final matrix construction, and an LDPC code is obtained according to a check matrix corrected and extended on the basis of the base exponential matrix.

An encoder for an LDPC code with variable code lengths is provided in an embodiment of the present invention. The encoder includes:

a base exponential matrix storing unit, configured to store a base exponential matrix;

an extending unit, configured to obtain a check matrix by extending the exponential matrixes each corresponding to each code length based on an extension factor, wherein the exponential matrixes each corresponding to each code length is obtained by correcting the base exponential matrixes; and an encoding unit, configured to encode the LDPC code by using the check matrix obtained by the extending unit.

A decoder for an LDPC code with variable code lengths is provided in an embodiment of the present invention. The decoder includes:

a base exponential matrix storing unit, configured to store a base exponential matrix;

an extending unit, configured to obtain a check matrix by extending the exponential matrix corresponding to each code length based on an extension factor, wherein the exponential matrix corresponding to each code length is obtained by correcting the base exponential matrix; and a decoding unit, configured to decode the LDPC code with a code length by using the check matrix obtained by the extending unit.

The method for constructing the LDPC codes with variable code lengths, which supports continuous changes in code lengths and is provided in an embodiment of the present invention, may be used to ensure that no small cycles occur at each required code length of the LDPC code obtained through multiple constructions. Thus, the performance can be greatly improved.

BRIEF DESCRIPTION OF THE DRAWINGS

FIG. 3 shows a cyclic shift matrix.

DETAILED DESCRIPTION OF THE EMBODIMENTS

Figure 1:
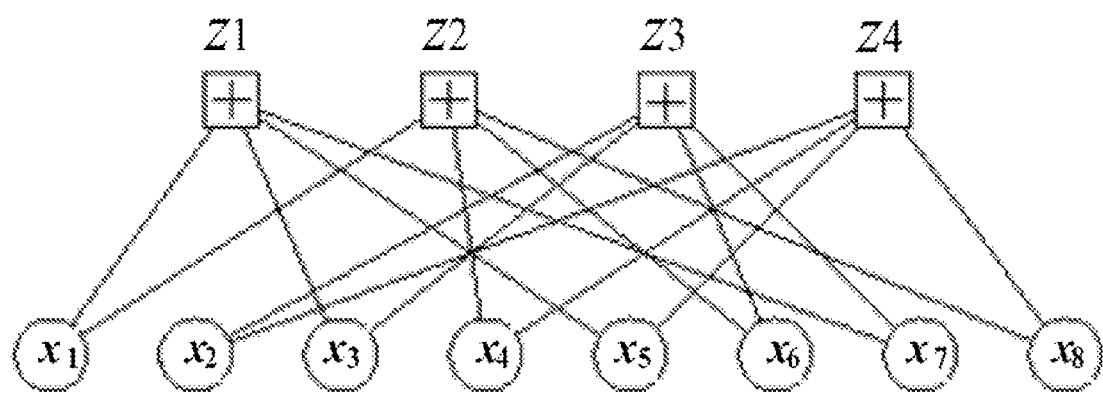
FIG. 1 shows a Tanner graph of an LDPC code.
Figure 2:
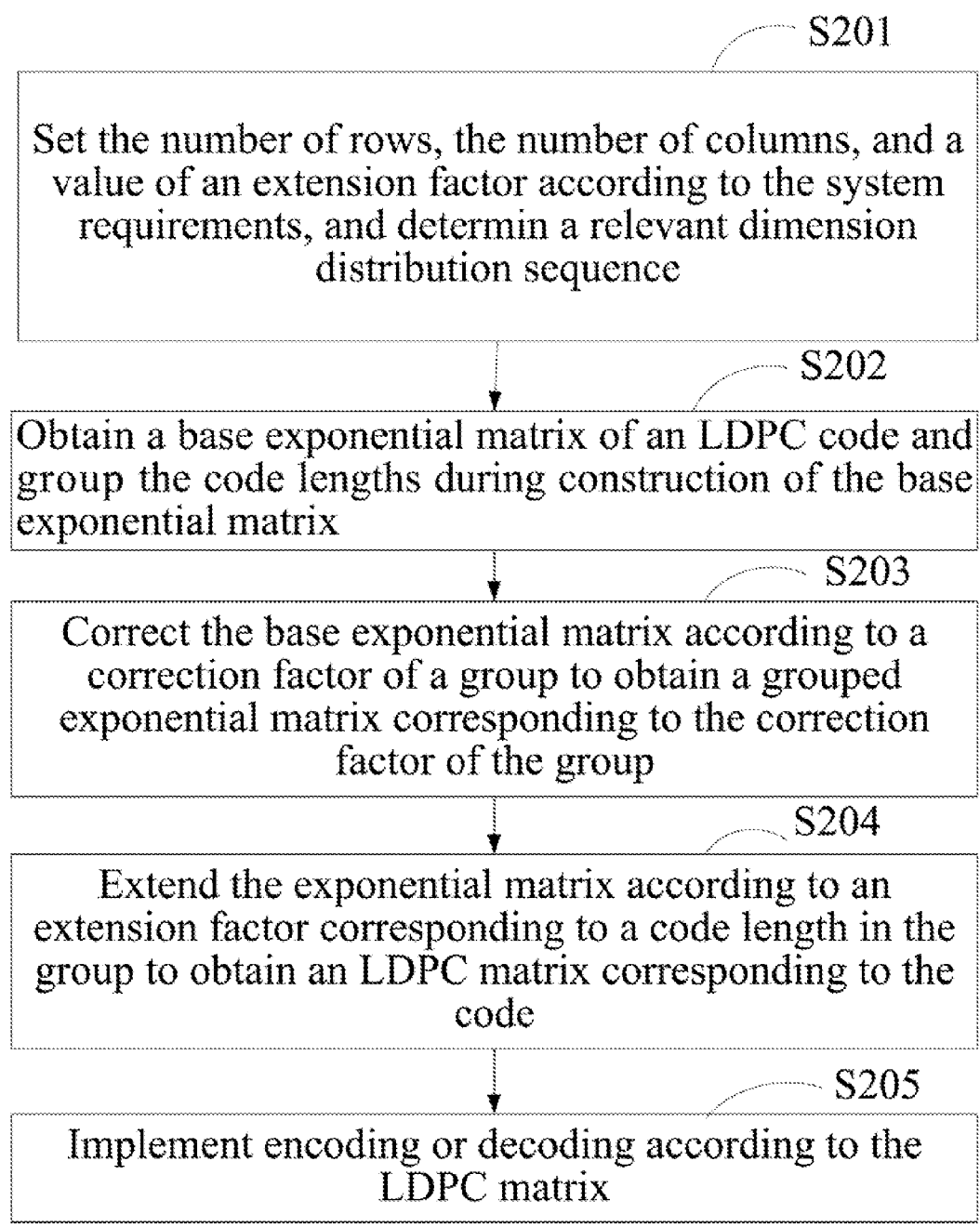
FIG. 2 is a flowchart of a method for encoding or decoding the LDPC codes with variable code lengths in an embodiment of the present invention.

The present invention provides a method for constructing the LDPC codes with variable code lengths, and encoding or decoding the LDPC codes. The encoding or decoding method supports continuous changes in code lengths. FIG. 2 is a flowchart of a method for encoding or decoding the LDPC codes with variable code lengths in an embodiment of the present invention. This method includes the following steps:

S201: Set the number of rows, the number of columns, and value of extension factors in exponential matrix according to the system requirements, and determine a relevant dimension distribution sequence. The dimension distribution sequence can be obtained by using a density evolution (DE) method.

S202: Obtain a base exponential matrix of an LDPC code, and group code lengths during construction of the base exponential matrix.

The extension factors corresponding to code lengths are grouped in ascending order. The smallest code length of a group is an integral multiple of the smallest code length in the previous group of the group. In specific operations, grouping extension factors is equivalent to grouping code lengths. The grouping principles may be changed to in the descending order or another principles. Clear principles are required to ensure that the grouping process is correctly complete. When the extension factors corresponding to the code lengths are grouped in descending order, the smallest code length of a group is an integral multiple of the smallest code length in the next group of the group.

When the extension factors are grouped in ascending order, if the smallest code length in a group is not an integral multiple of the smallest code length in the previous group, a new code length sequence may be constructed. The constructed code length sequence includes all sequences required by the system, and may ensure that the smallest code length in a group is an integral multiple of the smallest code length in the previous group. Generally, the code length value may be increased in the code sequence required by the system. To implement the method mentioned above, during the grouping, certain code lengths can be grouped according to grouping principles, and other code lengths that are not grouped form another group.

Through the first exponential matrix construction, the mother matrix and exponential matrix of the first group are obtained. During construction of the exponential matrix, it should be ensured as much as possible that no small cycle occurs when all extension factors in this group are used to extend the exponential matrix, and that the cycle distribution in a corresponding matrix is optimal. The mother matrix of the first group remains unchanged after the mother matrix is obtained.

The second matrix construction is implemented on the basis of the mother matrix (of the first group) and exponential matrix to obtain the exponential matrix of the second group. Still, it should be ensured as much as possible that no small cycle occurs when all extension factors in this group are used to extend the exponential matrix, and that the cycle distribution in a corresponding matrix is optimal.

Another matrix construction is implemented on the basis of the mother matrix and the exponential matrix of the previous group till the construction of exponential matrixes for all groups is complete. If only one group exists, only one exponential matrix construction process is required. The exponential matrix obtained during the final construction is stored. The exponential matrix obtained during the final construction is the base exponential matrix. The exponential matrixes of the other groups are obtained through grouping and correcting the base exponential matrix. During implementation, the check matrix for the LDPC code with each code length is obtained by extending the exponential matrix corresponding to the group where the extension factors reside on basis of the extension factors.

S203: Correct the base exponential matrix according to the grouping correction factor to obtain a grouped exponential matrix corresponding to the grouping correction factor.

Each group has an associated grouping correction factor. During implementation, the grouping correction factor is the ratio of the smallest code length in this group to the smallest code length in the group where the base exponential matrix resides.

S204: Extend the exponential matrix according to an extension factor corresponding to the code length in the group to obtain an LDPC matrix corresponding to the code length.

After the exponential matrix of each group is obtained, the LDPC matrix corresponding to each code length can be corrected to obtain the parity check matrix corresponding to this code length.

S205: Encoding or decoding is implemented according to the LDPC matrix.

After the check matrix for the LDPC code is obtained, encoding or decoding can be implemented on the basis of this check matrix.

The method for encoding or decoding the previous LDPC code with variable code lengths is described as follows:

Assume that an LDPC code $C_l$ (l=0, 1, ..., $M_S$) with code length $n_l$ needs to be constructed. Its mother matrix and exponential matrix are $M(H_l)$ and $E(H_l)$ (l=0, 1, ..., $M_S$) The implementation procedure is as follows:

S301: Set the number of rows and number of columns in the exponential matrix M×N and the values of extension factors, namely, $Z_0, Z_1, \ldots, Z_{M_S}$ ($Z_0 < Z_1 <, \ldots, < Z_{M_S}$), for various code lengths according to the system requirements, wherein $n_l = Z_l N$ ($l = 0, 1, \ldots, M_S$) Determine the dimension distribution sequence. The dimension distribution sequence may be obtained through DE.

S302: Divide the extension factors of all code lengths into T+1 groups ($Z^0, Z^1, \ldots, Z^T$) in ascending order. The smallest element in each group is an integral multiple of the smallest element in the previous group as follows:

$$Z^0 = (Z_{m_0}, Z_{m_0+1}, \ldots, Z_{m_1-1}), \quad (Z_{m_0} < Z_{m_0+1} < \ldots < Z_{m_1-1})$$

$$Z^1 = (Z_{m_1}, Z_{m_1+1}, \ldots, Z_{m_2-1}), \quad (Z_{m_1} < Z_{m_1+1} < \ldots < Z_{m_2-1}) \quad (Z_{m_1} = g_1 Z_{m_0})$$

$$\vdots$$

$$Z^T = (Z_{m_T}, Z_{m_T+1}, \ldots, Y_{m_{T+1}-1}), (Z_{m_T} < Z_{m_T+1} < \ldots < Z_{m_{T+1}-1}) \quad (Z_{m_T} = g_T Z_{m_{T-1}})$$

where: $Z_{m_0} = Z_0$, $Z_{m_{T+1}-1} = Z_{M_S}$, $g_i \in Z$.

If during grouping, a certain extension factor is not an integral multiple of the extension factor in the previous group, the $Y = (Y^0, Y^1, \ldots, Y^T)$ group sequence is constructed. In this sequence, the smallest element in each group $Y^k$ ($k = 1, 2, \ldots, T$) is an integral multiple of the smallest element in the previous group $Y^{k-1}$ ($k = 1, 2, \ldots, T$). In addition, the group sequence collection Y contains extension factors of all code lengths that need to be constructed, as follows:

$$Y^0 = (Y_{m_0}, Y_{m_0+1}, \ldots, Y_{m_1-1}), \quad (Y_{m_0} < Y_{m_0+1} < \ldots < Y_{m_1-1})$$

$$Y^1 = (Y_{m_1}, Y_{m_1+1}, \ldots, Y_{m_2-1}), \quad (Y_{m_1} < Y_{m_1+1} < \ldots < Y_{m_2-1}) \quad (Y_{m_1} = g_1 Y_{m_0})$$

$$\vdots$$

$$Y^T = (Y_{m_T}, Y_{m_T+1}, \ldots, Y_{m_{T+1}-1}), (Y_{m_T} < Y_{m_T+1} < \ldots < Y_{m_{T+1}-1}) \quad (Y_{m_T} = g_T Y_{m_{T-1}})$$

where: $Y_{m_0} \leq Z_0$, $Y_{m_{T+1}-1} \geq Z_{M_S}$, $g_k \in Z$ ($k = 1, 2, \ldots, Y^T$)

According to the constructed group sequence $Y = (Y^0, Y^1, \ldots, Y^T)$, the extension factors for all code lengths are grouped in ascending order. That is, all extension factors in group k are contained in group k of the Y group sequence: $Z^k \subset Y^k$ ($k = 0, 1, \ldots, T$)

S303: Implement a first matrix construction to obtain mother matrix $M(H_0)$ and exponential matrix $E(H_0)$. According to the selected dimension distribution sequence, the weight of each column in the mother matrix and exponential matrix is set, and the position and value of each non-zero element in each column in the exponential matrix are set according to the column weight. During construction, the values of the elements in exponential matrix $E(H_0)$ are selected from set $\{-1, 0, 1, \ldots, Z_{m_0}-1\}$. During selection, small cycles should be avoided if possible when all extension factors in group $Z^0$ are used to extend exponential matrix $E(H_0)$, and cycle distribution of a corresponding matrix should be optimal if possible.

A second matrix construction is implemented on the basis of mother matrix $M(H_0)$ and exponential matrix $E(H_0)$ to obtain exponential matrix $E(H_1)$. During the construction, the mother matrix remains unchanged. The cyclic shift factor at each position in the new exponential matrix is selected from $g_1 S_{ij}^{(0)}, g_1 S_{ij}^{(0)}+1, \ldots, g_1 S_{ij}^{(0)}+(g_1-1)$, where $S_{ij}^{(0)}$ indicates the cyclic shift factor at a corresponding position in $E(H_0)$. During selection, small cycles should be avoided if possible when all extension factors in group $Z^1$ are used to extend exponential matrix $E(H_1)$, and cycle distribution of a corresponding matrix should be optimal if possible.

The above steps are repeated to implement matrix construction for the k+1 number of times on the basis of mother matrix $E(H_0)$ and exponential matrix $E(H_{k-1})$ to obtain exponential matrix $E(H_k)$, where $k = 2, 3, \ldots, T$.

S304: After all matrixes are constructed, the system stores the exponential matrix obtained in the final construction, that is, the base exponential matrix $E(H_T)$. The exponential matrix $E(H_k)$ ($k = 0, 1, 2, \ldots, T-1$) corresponding to each other group is obtained by grouping and correcting the base exponential matrix $E(H_T)$:

$E(H_k) = \lfloor \alpha_k E(H_T) \rfloor$, where $\lfloor \ \rfloor$ means to round down.

That is, each non-negative element in base exponential matrix $E(H_T)$ is multiplied by the grouping correction factor of a corresponding group and the value is rounded down to the nearest integer to obtain the exponential matrix of the relevant code length, where the grouping correction factor is the ratio of the smallest element in the group to the smallest element in the group where the base exponential matrix resides:

$$\alpha_k = \frac{Z_{m_k}}{Z_{m_T}} \text{ or } \alpha_k = \frac{Y_{m_k}}{Y_{m_T}}.$$

The check matrix for the LDPC code with each code length is obtained by extending the exponential matrix $E(H_k)$ corresponding to group $Z^k$ where correction factor $Z_l$ resides on basis of this correction factor. That is, the all-zero matrix of $Z_l \times Z_l$ is used to replace $-1$ in $E(H_k)$, and the cyclic shift matrix $P^{S_{ij}}$ of right cyclic shift $S_{ij}$ in $Z_l \times Z_l$ is used to replace non-negative integer $S_{ij}$ in $E(H_k)$. The right cyclic shift amount is $S_{ij}$ (cyclic shift matrix $P^{S_{ij}}$ is shown in FIG. 3). In this case, check matrix $H_l$ of $MZ_l \times NZ_l$ is obtained.

If the code length range of an LDPC code with variable code lengths is narrow, the extension factors of all code lengths may be classified into one group. In this case, only one construction process is required to obtain the check matrixes corresponding to all required code lengths. Taking this case as an example, another embodiment of the method for encoding or decoding an LDPC code with variable code lengths is provided as follows:

The size M×N of the exponential matrix and values of extension factors, $Z_0, Z_1, \ldots, Z_{M_S}$ ($Z_0 < Z_1 <, \ldots, < Z_{M_S}$), for various code lengths are set according to the system requirements, wherein $n_l = Z_l N$ (l=0, 1, ..., $M_S$). Meanwhile, the dimension distribution sequence is specified and may be obtained through DE.

Through matrix construction, the mother matrix M(H) and exponential matrix E(H) are obtained. During construction, values of the elements in exponential matrix E(H) are selected from set $\{-1, 0, 1, \ldots, Z_0-1\}$. During selection, small cycles should be avoided if possible when all extension factors in group $Z_0, Z_1, \ldots, Z_{M_S}$ are used to extend exponential matrix E(H) and cycle distribution of a corresponding matrix should be optimal if possible. In this embodiment, the exponential matrix E(H) is the base exponential matrix.

After construction, the system stores the base exponential matrix, that is, exponential matrix E(H). The check matrix $H_l$ (l=0, 1, ..., $M_S$) for the LDPC code with each code length may be obtained by directly extending exponential matrix E(H) by using extension factor $Z_l$.

The method for encoding or decoding an LDPC code with variable code lengths that supports continuous changes in code lengths provided in an embodiment of the present invention may be used to ensure that no small cycles occur at each required code length of the LDPC code obtained through multiple constructions. Thus, the performance may be greatly improved.

Figure 4:
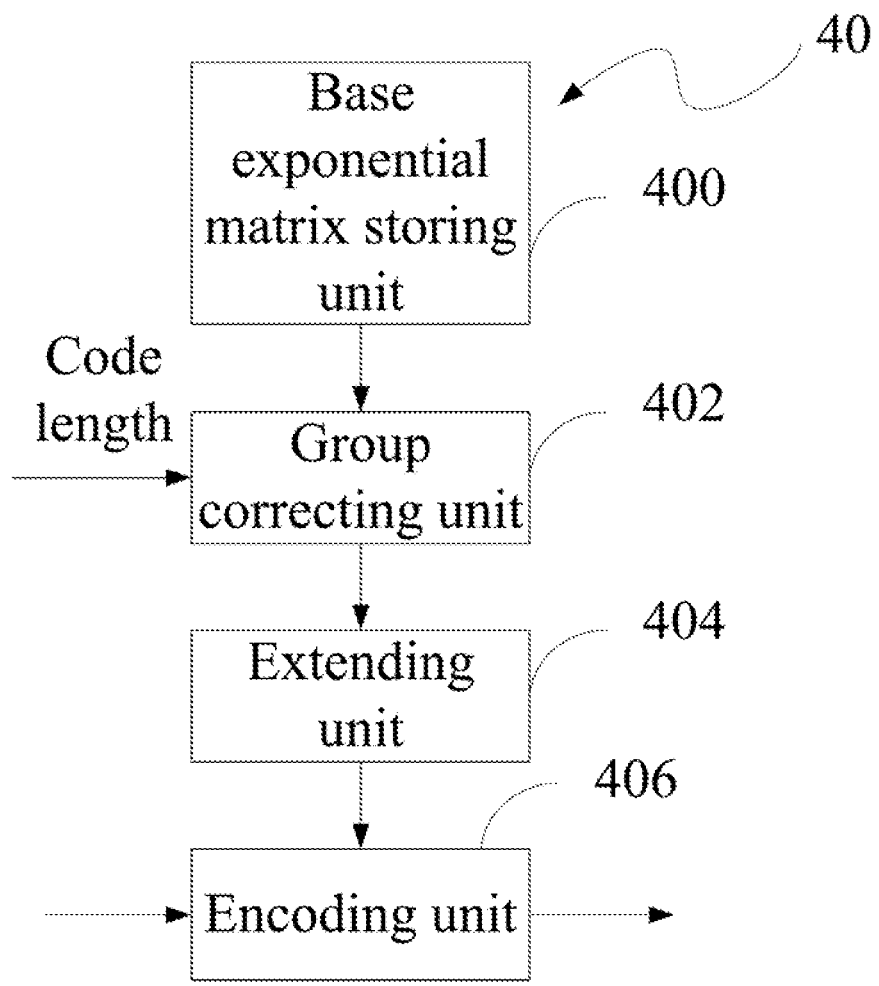
FIG. 4 shows a structure of an encoder in an embodiment of the present invention.

An LDPC encoder 40 is provided in an embodiment of the present invention, as shown in FIG. 4. The encoder 40 is configured to encode the LDPC code by using the preceding method. The encoder 40 includes:

a base exponential matrix storing unit 400, configured to store a base exponential matrix;

a group correcting unit 402, configured to: determine a relevant group $Z^k$ according to a code length of an LDPC to be encoded, and correct the base exponential matrix according to the grouping extension factor $$\alpha_k = \frac{Z_{m_k}}{Z_{m_T}} \text{ or } \alpha_k = \frac{Y_{m_k}}{Y_{m_T}}$$

of the relevant group to obtain an exponential matrix with a corresponding code length, that is, correct the base exponential matrix to obtain an exponential matrix for each code length;

an extending unit 404, configured to extend the exponential matrix for each code length by using the extension factor to obtain a check matrix; and an encoding unit 406, configured to encode an LDPC code with a code length by using the check matrix $H^k$ obtained through the extending unit 404.

According to the preceding embodiment of the method for encoding or decoding an LDPC code with variable code lengths, when only one group is involved, the grouping unit 402 is not required, and the extending unit 404 directly extends the base exponential matrix in the base exponential matrix storing unit 400 by using the extension factor to obtain the check matrix.

Figure 5:
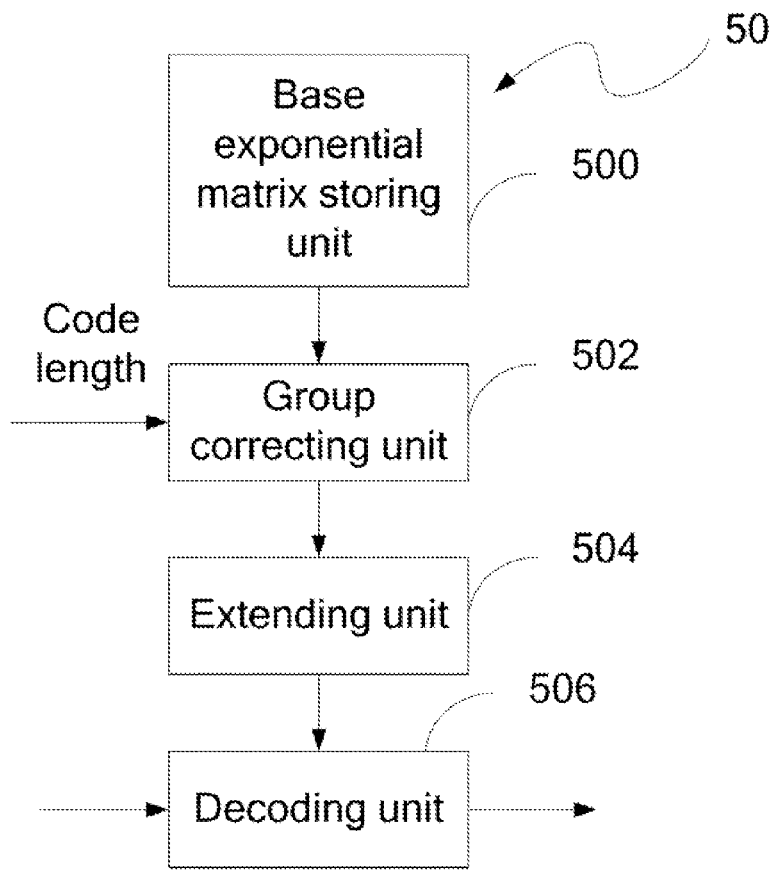
FIG. 5 shows a structure of a decoder in an embodiment of the present invention.

An LDPC decoder 50 is provided in an embodiment of the present invention, as shown in FIG. 5. The decoder 50 decodes the LDPC code by using the preceding method for encoding or decoding an LDPC code with variable code lengths. The decoder 50 includes:

a base exponential matrix storing unit 500, configured to store a base exponential matrix;

a group correcting unit 502, configured to: determine a relevant group $Z^k$ according to the code length of an LDPC to be encoded, and correct the base exponential matrix according to the grouping extension factor $$\alpha_k = \frac{Z_{m_k}}{Z_{m_T}} \text{ or } \alpha_k = \frac{Y_{m_k}}{Y_{m_T}}$$

of the relevant group to obtain an exponential matrix of the code length, that is, correct the base exponential matrix to obtain an exponential matrix for each code length;

an extending unit 504, configured to extend the exponential matrix for each code length by using the extension factor to obtain a check matrix; and a decoding unit 506, configured to decode an LDPC code with a code length by using the check matrix $H_k$ obtained through the extending unit 504.

According to the preceding embodiment of the method for encoding or decoding an LDPC code with variable code lengths, when only one group is involved, the grouping unit 502 is not required, and the extending unit 504 directly extends the base exponential matrix in the base exponential matrix storing unit 500 by using the extension factor to obtain the check matrix.

The encoder or decoder for designing an LDPC code with variable code lengths that supports continuous changes in code lengths provided in an embodiment of the present invention may be used to ensure that no small cycles occur at each required code length of the LDPC code. Thus, the performance can be greatly improved.

Figure 6:
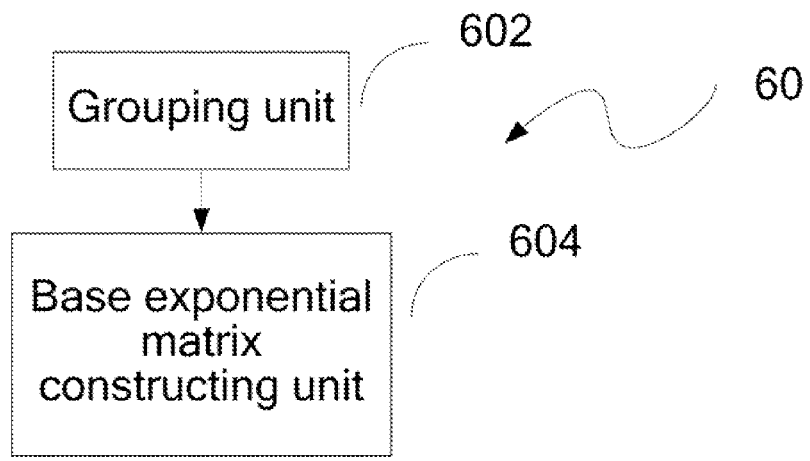
FIG. 6 is a flowchart of a device for encoding or decoding the LDPC codes with variable code lengths in an embodiment of the present invention.

Further, a device 600 for constructing an LDPC code with variable code lengths is provided in an embodiment of the present invention. As shown in FIG. 6, this device includes a grouping unit 602 and a base exponential matrix constructing unit 604.

The grouping unit 602 is configured to group code lengths. The grouping unit 602 can group the extension factors corresponding to the code lengths in ascending order where the smallest code length in each group is an integral multiple of the smallest code length in the previous group; or group the extension factors corresponding to the code lengths in descending order, where the smallest code length in each group is an integral multiple of the smallest code length in the next group.

The base exponential matrix constructing unit 604 is configured to: construct a base exponential matrix; construct a mother matrix and an exponential matrix of a first group during a first exponential matrix construction; construct an exponential matrix of a second group based on the mother matrix and exponential matrix of the first group during a second matrix construction; and construct a base exponential matrix based on the mother matrix of the first group and the exponential matrix of the previous group during another matrix construction, where the base exponential matrix is an exponential matrix obtained through the final matrix construction, and an LDPC code is obtained by extending the base exponential matrix. If only one group exists, only one construction process is involved.

In this embodiment, multiple construction processes are adopted to ensure that no small cycles occur in the obtained LDPC code at each code length. Thus, the performance is greatly improved.

Those skilled in the art can complete all or part of the steps in the preceding method by using a program to instruct the hardware. The program can be stored in a storage medium that can be read by a computer. When the program is executed, the processes of the methods provided in an embodiment of the present invention are included. The storage medium can be disk tape, compact disk, Read-Only Memory (ROM), or Random Access Memory (RAM).

What is claimed is:

1. A method for encoding or decoding a low density parity check (LDPC) code with variable code lengths, comprising:
    obtaining a base exponential matrix of the LDPC code and grouping the code lengths during construction of the base exponential matrix;
    correcting the base exponential matrix according to a grouping correction factor to obtain an exponential matrix of the group corresponding to the grouping correction factor;
    extending the exponential matrix according to extension factors corresponding to the code lengths in the group to obtain an LDPC matrix corresponding to the code length; and
    encoding or decoding the LDPC code according to the LDPC matrix.

2. The method according to claim 1, wherein the code lengths are grouped during construction of the base exponential matrix in the following way:
    grouping the code lengths according to the extension factors of the code lengths.

3. The method according to claim 2, wherein the grouping the code lengths according to the extension factors of the code lengths is:
    grouping the extension factors of the code lengths in ascending order, wherein a smallest code length of each group is an integral multiple of a smallest code length in a previous group of the group; or
    grouping the extension factors of the code lengths in descending order, wherein the smallest code length of each group is the integral multiple of a smallest code length in a next group of the group.

4. The method according to claim 3, wherein the obtaining the base exponential matrix of the LDPC code comprises:
    obtaining a mother matrix and an exponential matrix of a first group during a first exponential matrix construction;
    implementing a second matrix construction on the basis of the mother matrix and exponential matrix of the first group to obtain an exponential matrix of a second group; and
    implementing another matrix construction on the basis of the mother matrix of the first group and an exponential matrix of the previous group to complete construction of exponential matrixes of all groups, wherein an exponential matrix obtained during a final matrix construction is the base exponential matrix.

5. The method according to claim 1, wherein: during correction of the base exponential matrix according to the grouping correction factor, the exponential matrix of the group corresponding to the grouping correction factor is obtained, and the grouping correction factor is a ratio of a smallest code length in the group to a smallest code length in a group where the base exponential matrix resides.

6. The method according to claim 5, wherein the correcting the base exponential matrix according to the grouping correction factor comprises:
    multiplying each non-negative element in the base exponential matrix by grouping correction factors of relevant groups and rounding down to a nearest integer to obtain an exponential matrix of a relevant code length.

7. An encoder for a low density parity check (LDPC) code with variable code lengths, comprising:
    a base exponential matrix storing unit, configured to store a base exponential matrix;
    an extending unit, configured to obtain a check matrix by extending an exponential matrix corresponding to each code length through an extension factor, wherein the exponential matrix corresponding to each code length is obtained by correcting the base exponential matrix; and
    an encoding unit, configured to encode the LDPC code with the code length by using the check matrix obtained through the extending unit.

8. The encoder according to claim 7, further including:
    a group correcting unit, configured to: determine a group according to a code length of an LDPC to be encoded, and correct the base exponential matrix according to a grouping correction factor of the group to obtain an exponential matrix of a corresponding code length.

9. A decoder for a low density parity check (LDPC) code with variable code lengths, comprising:
    a base exponential matrix storing unit, configured to store a base exponential matrix;
    an extending unit, configured to obtain a check matrix by extending an exponential matrix corresponding to each code length through an extension factor, wherein the exponential matrix corresponding to each code length is obtained by correcting the base exponential matrix; and
    a decoding unit, configured to decode the LDPC code with the code length by using the check matrix obtained through the extending unit.

10. The decoder according to claim 9, further including:
    a group correcting unit, configured to: determine a relevant group according to a code length of an LDPC to be encoded, and correct the base exponential matrix according to a grouping correction factor of the relevant group to obtain an exponential matrix of a relevant code length.

11. A device for constructing a low density parity check (LDPC) code with variable code lengths, comprising:
    a grouping unit, configured to group code lengths; and
    a base exponential matrix constructing unit, configured to: construct a base exponential matrix; construct a mother matrix and an exponential matrix of a first group during a first exponential matrix construction; construct an exponential matrix of a second group based on the mother matrix and exponential matrix of the first group during a second matrix construction; construct exponential matrixes of all groups based on the mother matrix of the first group and an exponential matrix of a previous group during another matrix construction to obtain a base exponential matrix, wherein the base exponential matrix is an exponential matrix obtained through the final matrix construction, and an LDPC code is obtained according to a check matrix corrected and extended on the basis of the base exponential matrix.

12. The device according to claim 11, wherein principles for the grouping unit to group the code lengths are:
    grouping extension factors corresponding to the code lengths in ascending order, wherein a smallest code length in each group is an integral multiple of a smallest code length in the previous group; or
    grouping the extension factors corresponding to the code lengths in descending order, wherein the smallest code length in each group is the integral multiple of a smallest code length in a next group.

13. A computer readable storage medium, comprising computer program codes that cause the compute processor to execute the following steps when executed by a computer processor:

obtaining a base exponential matrix of the LDPC code and grouping the code lengths during construction of the base exponential matrix;

correcting the base exponential matrix according to a grouping correction factor to obtain an exponential matrix of the group corresponding to the grouping correction factor;

extending the exponential matrix according to extension factors corresponding to the code lengths in the group to obtain an LDPC matrix corresponding to the code length; and encoding or decoding the LDPC code according to the LDPC matrix.

14. The computer readable storage medium according to claim 13, wherein the obtaining the base exponential matrix of the LDPC code comprises:

obtaining a mother matrix and an exponential matrix of a first group during a first exponential matrix construction;

implementing a second matrix construction on the basis of the mother matrix and exponential matrix of the first group to obtain an exponential matrix of a second group; and implementing another matrix construction on the basis of the mother matrix of the first group and an exponential matrix of the previous group to complete construction of exponential matrixes of all groups, wherein an exponential matrix obtained during a final matrix construction is the base exponential matrix.

\* \* \* \* \*